(12) United States Patent
Otremba et al.

(10) Patent No.: US 10,755,999 B2
(45) Date of Patent: Aug. 25, 2020

(54) MULTI-PACKAGE TOP-SIDE-COOLING

(71) Applicant: Infineon Technologies Austria AG, Villach (AT)

(72) Inventors: Ralf Otremba, Kaufbeuren (DE); Uwe Kirchner, St. Michael i. Lav. (AT); Matteo-Alessandro Kutschak, Ludmannsdorf (AT); Klaus Schiess, Allensbach (DE); Bernd Schmoelzer, Radenthein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/363,570

(22) Filed: Mar. 25, 2019

(65) Prior Publication Data
US 2019/0295920 A1 Sep. 26, 2019

(30) Foreign Application Priority Data
Mar. 26, 2018 (DE) .................. 10 2018 107 094

(51) Int. Cl.
*H01L 23/40* (2006.01)
*H01L 23/367* (2006.01)
(Continued)

(52) U.S. Cl.
CPC ...... *H01L 23/4006* (2013.01); *H01L 21/4882* (2013.01); *H01L 23/3675* (2013.01);
(Continued)

(58) Field of Classification Search
CPC .......... H01L 23/34; H01L 23/36–3738; H01L 23/40–4093; H01L 25/072;
(Continued)

(56) References Cited

U.S. PATENT DOCUMENTS 4,739,447 A * 4/1988 Lecomte ............. H01L 23/4006
257/719
6,282,092 B1 * 8/2001 Okamoto ............... H01L 23/42
361/704

(Continued)

FOREIGN PATENT DOCUMENTS

DE 102006060768 A1 7/2007
DE 102011082986 A1 6/2012
(Continued)

*Primary Examiner* — Scott B Geyer
(74) *Attorney, Agent, or Firm* — Murphy, Bilak & Homiller, PLLC

(57) ABSTRACT

A power semiconductor arrangement includes a carrier and packages. Each package: encloses a power semiconductor die having first and second load terminals and configured to conduct a die load current between the load terminals; has a package body with a top side, a footprint side and sidewalls extending from the footprint side to the top side; a lead frame structure configured to electrically and mechanically couple the package to the carrier with the package footprint side facing the carrier, the lead frame structure including at least one first outside terminal electrically connected with the first load terminal of the die; a top layer arranged at the package top side and electrically connected with the second load terminal of the die. A top heatsink is attached to each package top layer, electrically contacted to each package top layer, and configured to conduct at least a sum of the die load currents.

20 Claims, 10 Drawing Sheets

(51) Int. Cl.
*H01L 23/498* (2006.01)
*H01L 25/07* (2006.01)
*H01L 21/48* (2006.01)
*H01L 25/00* (2006.01)

(52) U.S. Cl.
CPC ...... *H01L 23/49861* (2013.01); *H01L 25/072* (2013.01); *H01L 25/50* (2013.01); *H01L 2023/405* (2013.01); *H01L 2023/4031* (2013.01); *H01L 2023/4087* (2013.01)

(58) Field of Classification Search
CPC ......... H01L 23/4006; H01L 2023/4037; H01L 2023/405; H01L 2023/4031; H01L 23/498–49894
See application file for complete search history.

(56) References Cited

U.S. PATENT DOCUMENTS

| | | | |
|---|---|---|---|
| 9,691,892 B2 | 6/2017 | Mauder et al. | |
| 2006/0091530 A1 | 5/2006 | Wang | |
| 2006/0138452 A1* | 6/2006 | Knapp | H01L 23/051 257/177 |
| 2007/0138651 A1 | 6/2007 | Hauenstein | |
| 2007/0268673 A1 | 11/2007 | Ankireddi | |
| 2008/0037223 A1* | 2/2008 | Muller | H01L 23/4006 361/710 |
| 2009/0127676 A1 | 5/2009 | Gomez | |
| 2009/0166850 A1* | 7/2009 | Jeon | H01L 23/49816 257/706 |
| 2010/0284155 A1* | 11/2010 | Stolze | H01L 23/3121 361/728 |
| 2012/0068681 A1 | 3/2012 | Ejury | |
| 2012/0098117 A1 | 4/2012 | Sato et al. | |
| 2013/0003311 A1 | 1/2013 | Privitera et al. | |
| 2013/0341776 A1 | 12/2013 | Drobnik | |
| 2015/0216067 A1* | 7/2015 | McPherson | H01L 25/072 361/747 |
| 2016/0233149 A1 | 8/2016 | Otremba et al. | |
| 2017/0033091 A1* | 2/2017 | Schenk | H01L 23/051 |
| 2017/0148770 A1* | 5/2017 | Ishino | H02M 7/48 |
| 2017/0236774 A1 | 8/2017 | Fushie et al. | |
| 2018/0103536 A1* | 4/2018 | Pickering | H05K 7/20963 |
| 2019/0237416 A1* | 8/2019 | Gao | H01L 29/7787 |

FOREIGN PATENT DOCUMENTS

| | | |
|---|---|---|
| DE | 102015201045 A1 | 7/2016 |
| DE | 102015101674 A1 | 8/2016 |
| DE | 10215120396 A1 | 6/2017 |
| DE | 102017215480 A1 | 3/2018 |
| TW | 200616184 A | 5/2006 |

* cited by examiner

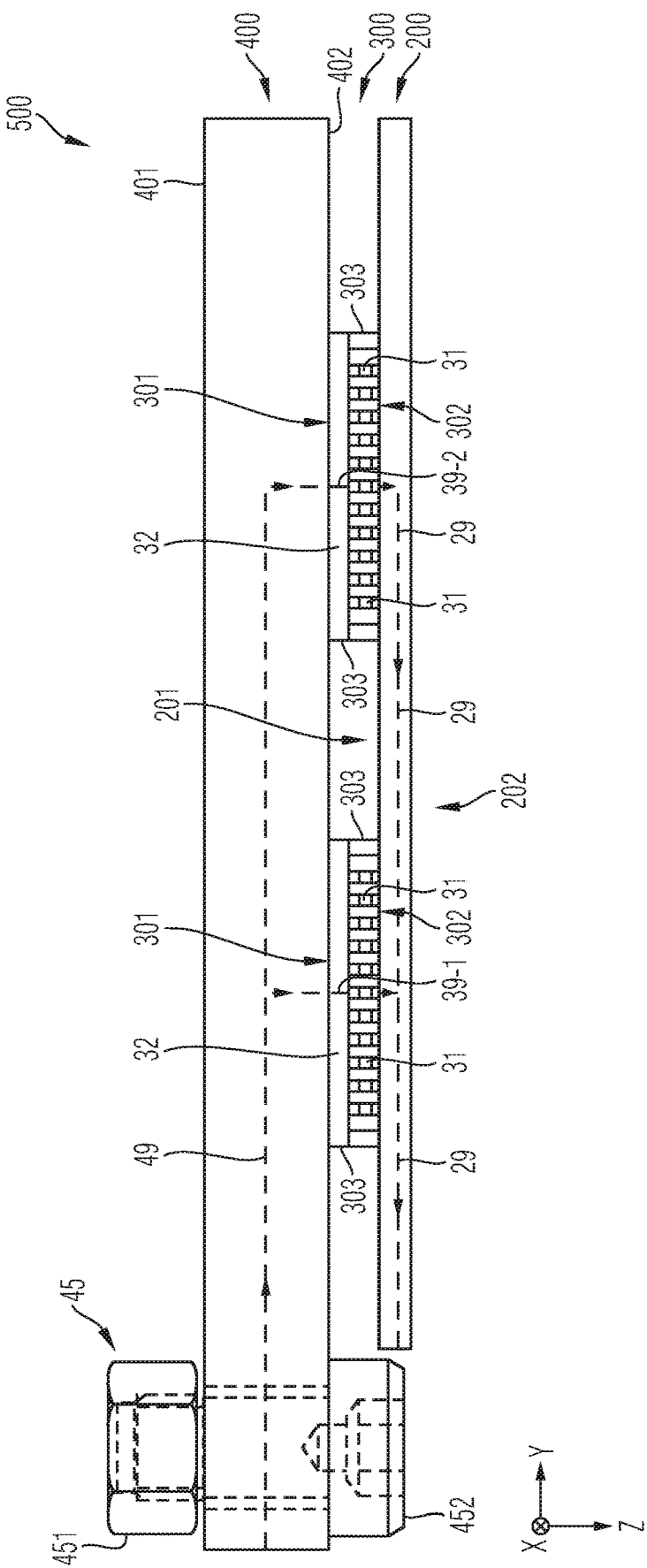

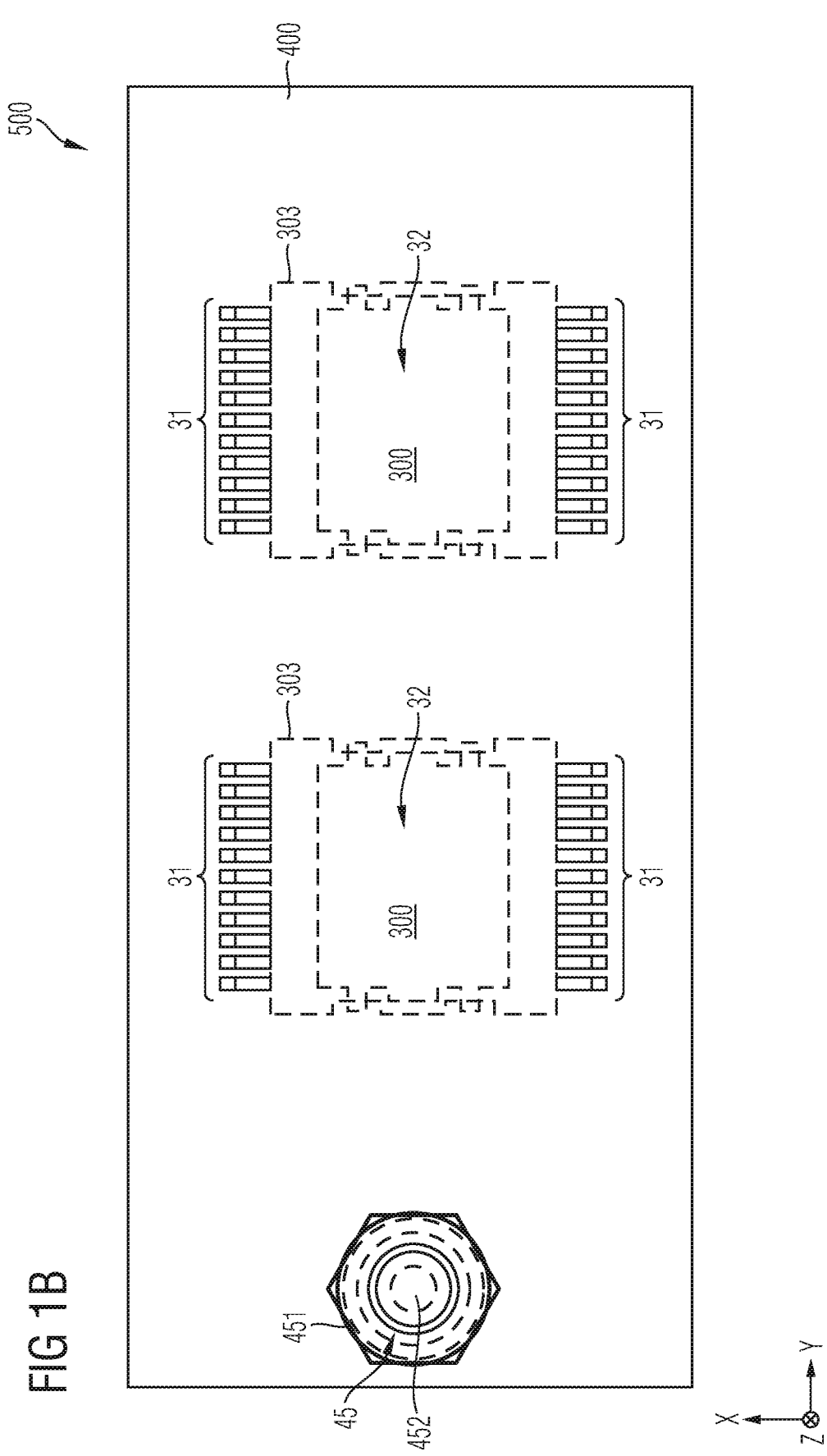

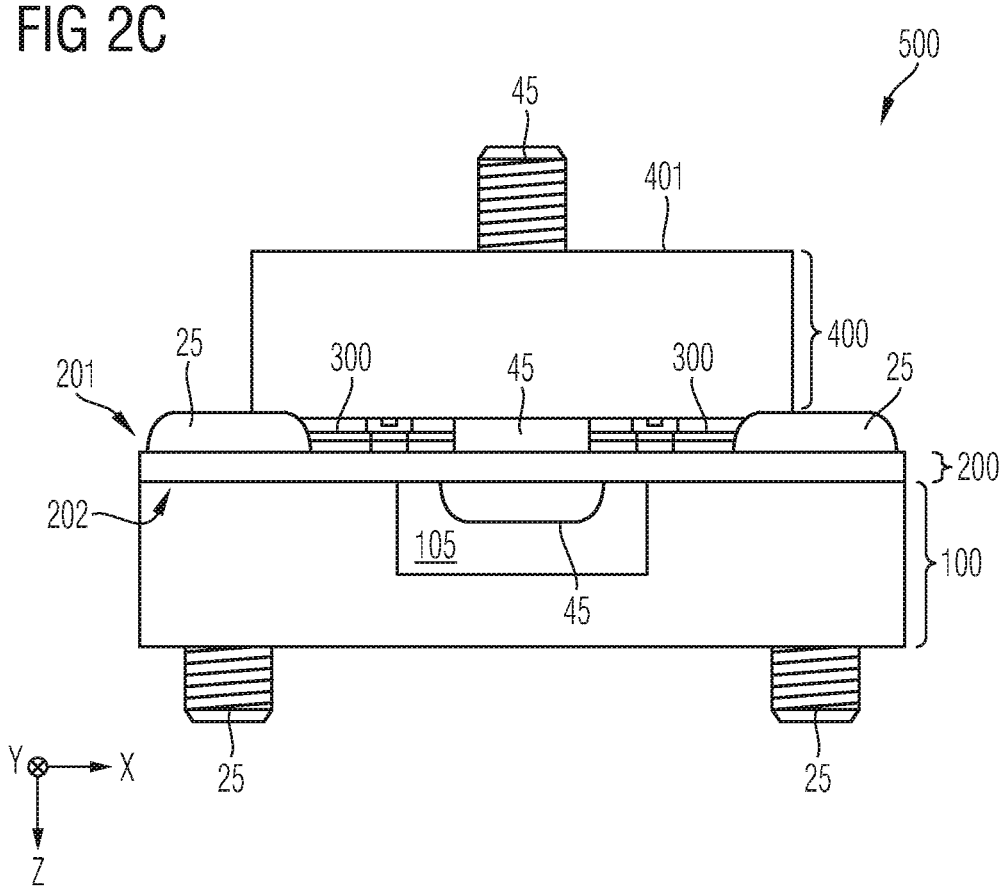

MULTI-PACKAGE TOP-SIDE-COOLING

TECHNICAL FIELD

This specification refers to embodiments of a power semiconductor arrangement comprising a plurality of packages disposed on a carrier, to embodiments of a system having such power semiconductor arrangement and configured for supplying power to a load subsystem, and to embodiments of a method of manufacturing a power semiconductor arrangement. In particular, this specification refers to simultaneously cooling a plurality of packages.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a power semiconductor die configured to conduct a load current along a load current path between two load terminals of the die. Further, the load current path may be controlled, e.g., by means of an insulated electrode, sometimes referred to as gate electrode. For example, upon receiving a corresponding control signal from, e.g., a driver, the control electrode may set the power semiconductor device in one of a conducting state and a blocking state.

After the power semiconductor die has been manufactured, it is usually installed within in a package, e.g., in a manner that allows the package with the die to be arranged within an application, e.g., in a power converter or a power supply, e.g., such that the die may be coupled to a carrier, e.g., a printed circuit board (PCB).

To this end, a technology commonly referred to as surface-mount technology (SMT) is known, wherein this notion may generally refer to producing electronic circuits in which the components are mounted or placed directly onto the surface of a PCB. Such a component is hence referred to as surface-mount-device (SMD) component. For example, this technology has replaced, at least in some application areas, the so-called through-hole technology construction method of fitting components with wire leads into holes in the circuit board.

Generally, an SMD component can be smaller than its through-hole counterpart. It may have short pins or leads of various styles, flat contacts (also known as "terminal pads"), a matrix of solder balls (e.g., a so-called Ball Grid Array (BGA)), and/or terminations on the package body of the component.

Exemplary configurations of an SMD package are known from documents DE 10 2015 101 674 A1 and DE 10 2015 120 396 A1. Each of these SMD packages encloses a power semiconductor die and has a package body with a package top side, a package footprint side and package sidewalls, wherein the package sidewalls extend from the package footprint side to the package top side. The die has a first load terminal and a second load terminal and is configured to block a blocking voltage applied between said load terminals. The packages each further comprise a lead frame structure configured to electrically and mechanically couple the package to a carrier with the package footprint side facing to the carrier. The lead frame structure comprises outside terminals extending out of the package sidewall and electrically connected with the first load terminal of the die. Further, each of the packages comprise a top layer arranged at the package top side and being electrically connected with the second load terminal of the die.

Accordingly, each of these SMD packages known from documents DE 10 2015 101 674 A1 and DE 10 2015 120 396 A1 may exhibit a package top side that faces away from the carrier and that is equipped with a top layer to which a heat dissipation device, e.g., a top heatsink, may be mounted. Thereby, heat can be removed away from the package that encloses the die. Such kind of packages may hence be referred to as a SMD-Top Side Cooling (SMD-TSC) packages.

The primary function of the heat dissipation device is to remove heat away from the package body. To this end, it is known to couple a top heatsink to the top layer, wherein the top heatsink may be electrically insulated from the top layer.

SUMMARY

According to an embodiment, a power semiconductor arrangement comprises a carrier and a plurality of packages. Each package: encloses a power semiconductor die, wherein the die has a first load terminal and a second load terminal and is configured to block a blocking voltage applied between said load terminals and to conduct a die load current between said load terminals; has a package body with a package top side, a package footprint side and package sidewalls, the package sidewalls extending from the package footprint side to the package top side; has a lead frame structure configured to electrically and mechanically couple the package to the carrier with the package footprint side facing to the carrier, the lead frame structure comprising at least one first outside terminal electrically connected with the first load terminal of the die; and has a top layer arranged at the package top side and being electrically connected with the second load terminal of the die. The power semiconductor arrangement comprises a top heatsink. The top heatsink: is attached to each of the top layers of the packages; electrically contacted to each of the top layers of the packages; and configured to conduct at least the sum of the die load currents.

According to a yet further embodiment, a system comprises a DC power supply; a load subsystem; a main power path (800) that couples the DC power supply to the load subsystem so as to allow the DC power supply to provide power to the load subsystem via the main power path; and a power semiconductor arrangement arranged in the main power path, wherein the power semiconductor arrangement is configured to selectively set the main power path in one of a conducting state and a blocking state. The power semiconductor arrangement can be configured in a manner as described in the preceding paragraph.

According to a further embodiment, a method of manufacturing a power semiconductor arrangement comprises providing a carrier; and providing a plurality of packages. Each package: encloses a power semiconductor die, wherein the die has a first load terminal and a second load terminal and is configured to block a blocking voltage applied between said load terminals and to conduct a die load current between said load terminals; has a package body with a package top side, a package footprint side and package sidewalls, the package sidewalls extending from the package footprint side to the package top side; has a lead frame structure configured to electrically and mechanically couple the package to the carrier with the package footprint side facing to the carrier, the lead frame structure comprising at least one first outside terminal electrically connected with the first load terminal of the die; and has a top layer arranged at the package top side and being electrically connected with the second load terminal of the die. The method further comprises providing a top heatsink that is configured to conduct at least the sum of the die load currents. Then, the top heatsink is attached to each of the top layers of the packages such that the top heatsink is electrically contacted to each of the top layers of the packages.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures reference numerals may designate corresponding parts. In the drawings:

FIGS. 1A-1D schematically and exemplarily illustrate sections of two vertical cross-sections, a section of a horizontal projection and a section of a perspective view of a power semiconductor arrangement in accordance with one or more embodiments; and FIGS. 2A-2D schematically and exemplarily illustrate sections of two vertical cross-sections, a section of a horizontal projection and a section of a perspective view of a power semiconductor arrangement in accordance with one or more embodiments;

DETAILED DESCRIPTION

Figure 1C:
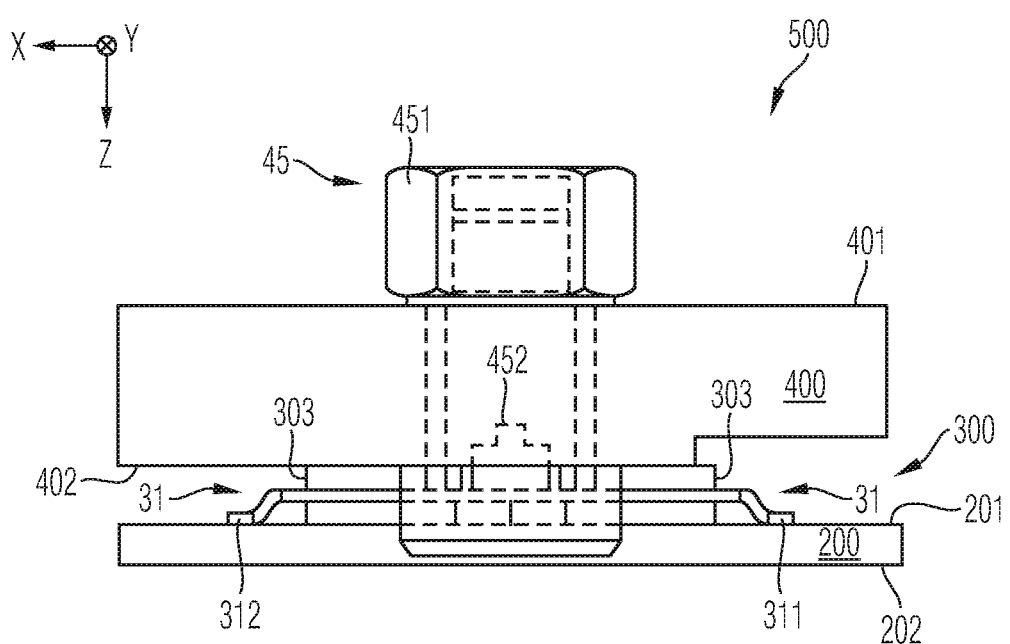
Figure 1D:
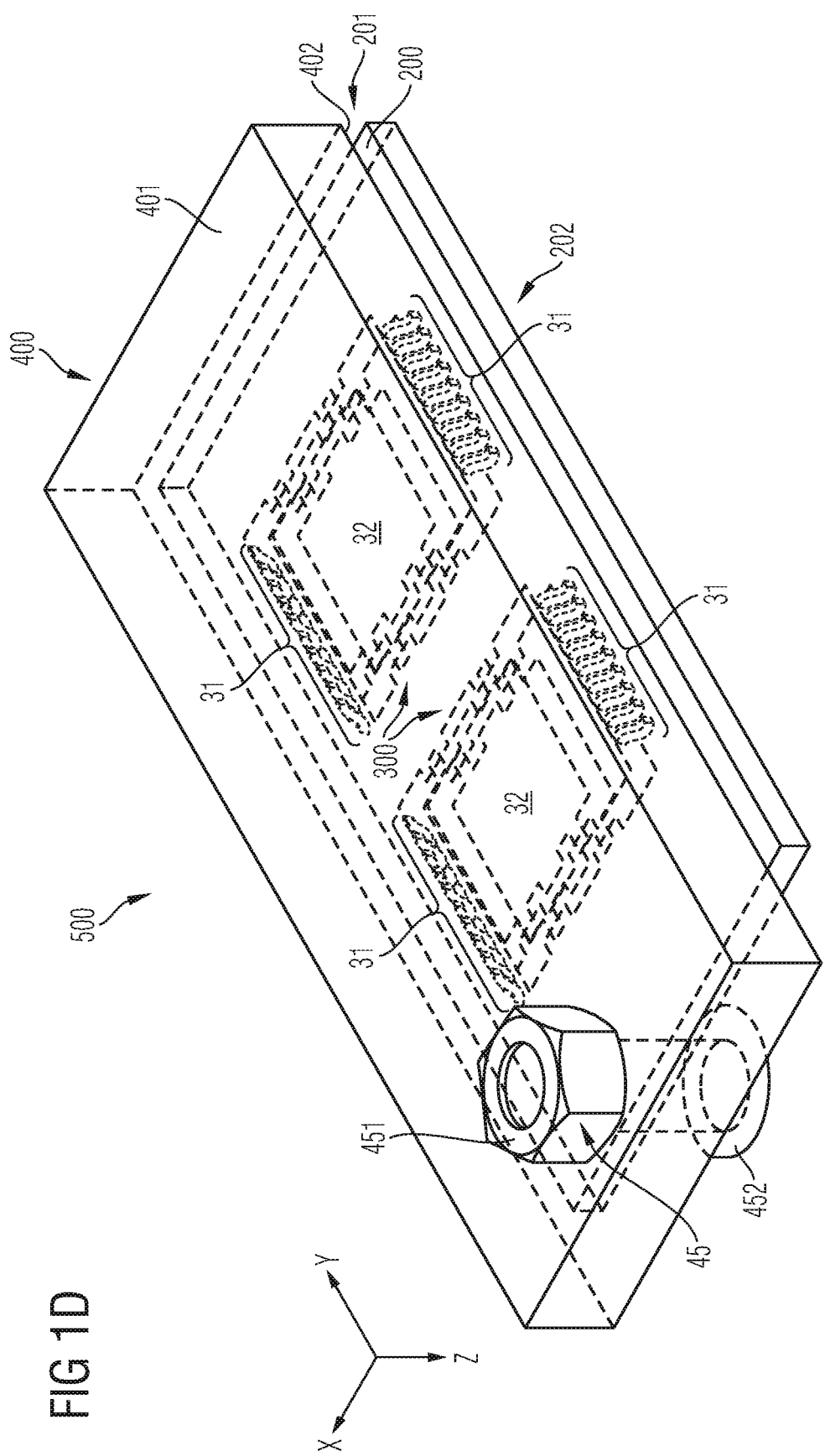

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor die, e.g., a power semiconductor die that may be used within a power converter or a power supply. Thus, in an embodiment, such die can be configured to carry a load current that is to be fed to a load and/or, respectively, that is provided by a power source. For example, the die may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. A plurality of such diode cells and/or such transistor cells may be integrated in the die.

The term "power semiconductor die" as used in this specification intends to describe a single die with high voltage blocking and/or high current-carrying capabilities. In other words, such power semiconductor die is intended for high current, typically in the Ampere range, e.g., up to 5 or 100 Amperes, and/or voltages typically above 15 V, more typically up to 40 V, and above, e.g., up to at least 500 V or more than 500 V, e.g. at least 600 V. Herein, the power semiconductor die(s) are also simply referred to as die(s).

For example, the power semiconductor die described below may be a die that is configured to be employed as a power component in a low-, medium- and/or high voltage application. Further, the term "power semiconductor die" as used in this specification is not directed to logic semiconductor devices that are used for, e.g., storing data, computing data and/or other types of semiconductor based data processing.

Before being able to be employed within an application, the power semiconductor die is usually included within a package that may allow mechanically mounting and electrically connecting the die within the application, e.g., also for heat distribution purposes. As has been introductorily mentioned, this may include applying the surface-mount technology (SMT).

Exemplary embodiments of the package disclosed herein are surface-mount device (SMD) packages. For example, embodiments of the package disclosed herein are SMD packages with flat contacts that interface with a carrier, e.g., a PCB.

Figure 3:
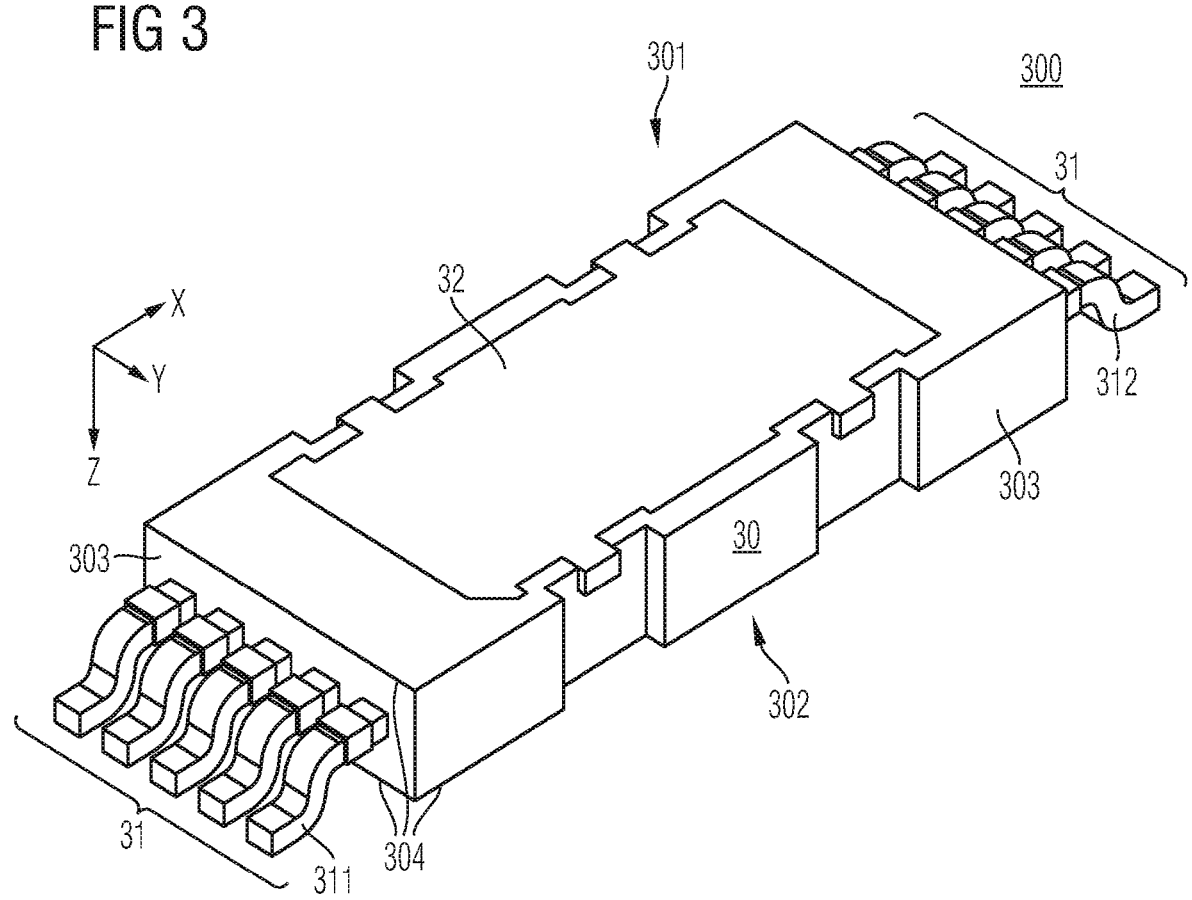
FIG. 3 schematically and exemplarily illustrates a section of a perspective view of a package in accordance with one or more embodiments.

An exemplary package 300 is illustrated in FIG. 3, to which it will be referred in the following. For example, the package 300 has a package body 30 which may be essentially be configured in a manner as described in DE 10 2015 101 674 A1 and/or in DE 10 2015 120 396 A1.

The package 300 encloses a power semiconductor die (not illustrated), in the following also referred to as die. For example, the die has one of a power semiconductor transistor configuration or a power semiconductor diode configuration, e.g., a MOSFET configuration, an IGBT configuration, or a configuration derived from these basic configurations.

In an embodiment, the power semiconductor die enclosed in the package 300 is based on silicon (Si). In another embodiment, the power semiconductor die enclosed in the package 300 is based on a wide-bandgap (WBG) semiconductor material, e.g., silicon carbide (SiC) or gallium nitride (GaN) or another WBG semiconductor material.

The power semiconductor die may hence comprise a first load terminal (not illustrated) and a second load terminal (not illustrated) and may be configured to conduct a load current between these load terminals. The load current may be within the range of 1 A to 700 A, for example within the range of at least 10 A to 50 A. The maximum load current that can continuously be conducted by the die can be indicated by a load current rating of the die. Further, the enclosed die may be configured to block a blocking voltage applied between the first load terminal and the second load terminal, e.g., within the range of 10 V to 1000 V, e.g., within the range of 50 V to 600 V. The maximum voltage that can continuously be blocked by the die can be indicated by a blocking voltage rating of the die.

In an embodiment, the die can be one of a power diode, in which case the first load terminal can be anode port and the second load terminal can be cathode port, a power IGBT, in which case the first load terminal can be an emitter terminal and the second load terminal can be collector terminal, a MOSFET, in which case the first load terminal can be a source terminal and the second load terminal can be drain terminal, or a power device derived from one or more of these basic configurations, e.g., a JFET (Junction Field Effect Transistor), sometimes referred to as SFET.

Embodiments described herein focus on the case where the die is implemented with a transistor configuration (e.g., a MOSFET configuration) such that the package enclosing such die may, e.g., together with further packages, may form at least a part of a power main switch, e.g., for controlling power supply from a battery (or another DC supply) to a load subsystem. For example, the die is optimized with respect to a priority of low conduction losses over low switching losses, e.g., as described in U.S. Pat. No. 9,691,892 B2 and parallel DE 10 2015 201 045 A1, the content of which is hereby incorporated by reference. However, the present specification is not limited to such configurations.

Further, the die that is enclosed by the package 300 can have a vertical configuration, according to which the first load terminal is arranged at a die frontside and the second load terminal is arranged at a die backside. In lateral directions, e.g., in the lateral directions X and Y and linear combinations thereof, the die may be terminated by a die edge, e.g., a side surface.

The package 300 that encloses the die has a package body 30 with a package top side 301, a package footprint side 302 and package sidewalls 303, the package sidewalls 303 extending from the package footprint side 302 to the package top side 301 and forming an edge 304 therewith. The package body 30 can comprise or be made of a molding mass.

For example, the package body 300 exhibits a flat configuration, according to which: each of the package top side 301 the package footprint side 302 extend substantially horizontally; the package sidewalls 303 extend substantially vertically; and a maximum horizontal extension of the package footprint side 302 amounts to at least twice of a maximum vertical extension of the package sidewalls 303.

For example, the die is sandwiched in between the package top side 301 and the package footprint side 302. The package body 30 may entirely surround the die and seal the die against the environment.

The package 300 enclosing the die may be mounted on a carrier (cf. reference numeral 200 in FIGS. 1A-2D and FIG. 4), e.g., in accordance with the surface-mount technology. For example, the package 300 may be a surface-mount device (SMD) package. Further, when being mounted on the carrier 200, the die included in the package 300 may be electrically connected with other components, e.g., further packages, that are disposed on the carrier 200.

The die may be arranged in the package 300 in such a manner that the die frontside faces to the package footprint side 302 and that the die backside faces to the package top side 301, or vice versa. Further, the package footprint side 302 may face to a front side surface 201 of the carrier 200. For example, the front side surface 201 is arranged horizontally, e.g., in parallel to the plane defined by the first lateral direction X and the second lateral direction Y.

For example, the package 300 comprises a lead frame structure 31 configured to electrically and mechanically couple the package 300 to the carrier 200. The lead frame structure 31 may for example be configured to couple the package 300 to the carrier 200 with the package footprint side 302 facing to the carrier 200, for example such that the package footprint side 302 faces to the front side surface 201 of the carrier 200, as illustrated in FIG. 1A.

The lead frame structure 31 may serve as an electrically conductive interface between the load terminals of the die (and, if present, the one or more further terminals of the die) and other components (not illustrated in FIG. 3) that are fixed at the carrier 200. For example, the carrier 200 may comprise or be provided with other components (for example with one or more further packages, and/or a controller, a sensor, a passive component, a load or the like) to which the terminals of the die are to be coupled via the lead frame structure 31. A connection between the lead frame structure 31 and the terminals of the die, e.g., the load terminals, may be realized by package internal connection means (not illustrated). For connecting the die with other components fixed to the carrier 200, the lead frame structure 31 may comprise one or more outside terminals, as will now be explained in more detail:

For example, the outside terminals of the lead frame structure 31 comprise at least one first outside terminal 311 extending out of the package footprint side 302 and/or out of one of the sidewalls 303 and electrically connected with the first load terminal of the die. Of course, there can be more than one of such first outside terminal 311 that are each connected to the first load terminal of the die. Further, the outside terminals of the lead frame structure 31 may comprise at least one second outside terminal 312 extending out of the package footprint side 302 and/or out of one of the sidewalls 303 (for example out of a sidewall 303 arranged opposite to the sidewall 303 out of which the first outside terminal(s) 311 may extend, cf. FIG. 3) and electrically connected with a control terminal (e.g., a gate terminal) of the die. Of course, there can be more than one of such second outside terminal 312 that are each connected to the control terminal of the die. Further, the outside terminals of the lead frame structure 31 may comprise at least one third outside terminal (not illustrated) and/or at least one fourth outside terminal (not illustrated) extending out of the package footprint side 302 and/or out of one of the sidewalls 303 and electrically connected with a sensor terminal (e.g., a current sensor terminal) of the die. Of course, there can be more than one of such third/forth outside terminal.

Each of the outside terminals 311, 312 of the lead frame structure 31 may be configured to be electrically and mechanically coupled to the carrier 200, e.g., by soldering.

Within the present specification, the term "outside" may express that the first outside terminal(s) 311 and the second outside terminal(s) 312 may be configured to be electrically contacted by means of components external of the package body 30.

In an embodiment, the outside terminals 311, 312 are planar outside terminals. For example, within the present specification, the term "planar" may express that the first terminal(s) 311 and the second terminal(s) 312 may exhibit a respective substantially plane bottom surface that has a size with horizontal dimensions (e.g. along each of the first lateral direction X and the second lateral direction Y) at least as great as a vertical dimension of the respective terminal 311, 312 (e.g. along the vertical direction Z), as exemplarily illustrated in FIG. 3. For example, the lead frame structure 31 has a surface-mount configuration. To this end, the outside terminals 311 and 312 may be configured to allow mounting the package 300 in accordance with the surface-mount technology. Further, each of the first outside terminal 311 and the second outside terminal 312 may be so-called flat contacts (also known as "terminal pads") formed in accordance with the surface-mount technology.

In accordance with the embodiments as illustrated FIGS. 1A-3, the outside terminals 311 and 312 can be configured as contact pins or as contact balls.

Figure 4:
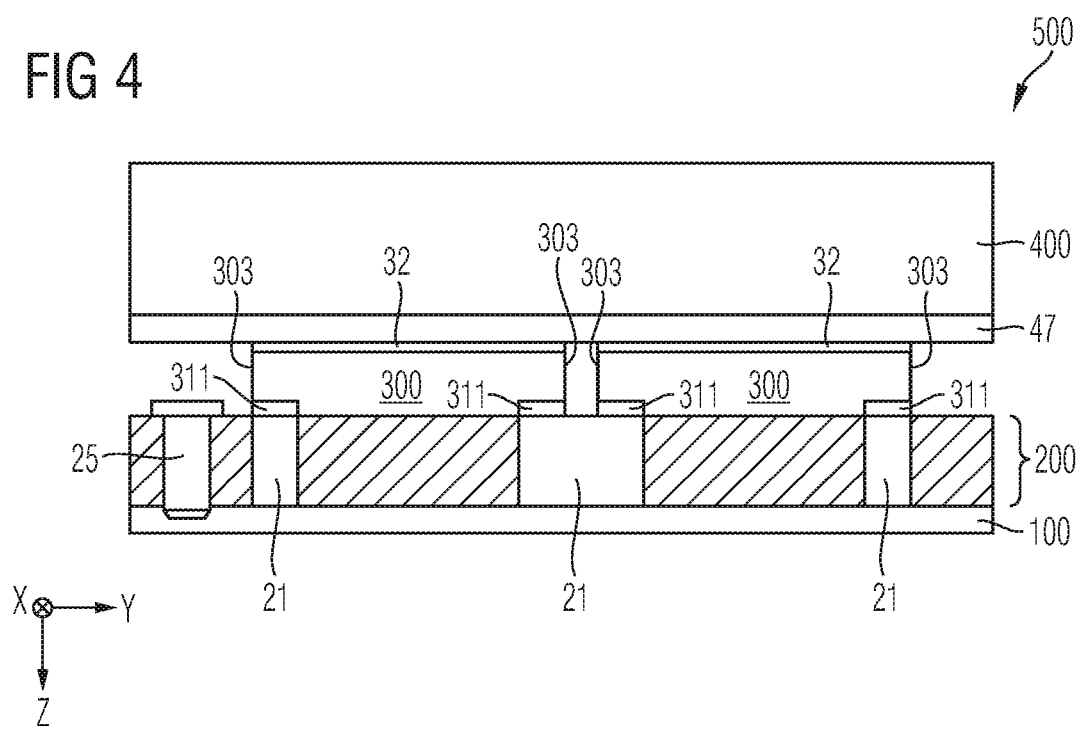
FIG. 4 schematically and exemplarily illustrates a section of a vertical cross-section of a power semiconductor arrangement in accordance with one or more embodiments.

In contrast to the schematic illustrations in FIGS. 1A-3, the package 300 may be also be a leadless package, e.g., an SMD leadless package, e.g., as schematically illustrated in FIG. 4. For example, the first outside terminal(s) 311 may in such configuration form a part of the package footprint side 302 and/or a part of the package sidewall 303. E.g., the first outside terminal(s) 311 may terminate co-planarily with the package footprint side 303 of the package body 30 and/or form a part of the package edge 304. Examples for SMD leadless packages include Infineon packages that are commercially available under the names "Super SO8 package" or "TO leadless packages" or "TOLL packages".

The first outside terminal(s) 311 may be arranged separately and electrically insulated from the second outside terminal(s) 312.

For example, on the carrier 200, a first contact area of the first outside terminal 311 may be electrically connected with one or more first conductive traces (not illustrated in FIG. 3), e.g., copper lines or conductors/connection members (cf. reference numeral 21 in FIGS. 2A and 4), of the carrier 200, and a second contact area of the second outside terminal 312 may be electrically connected with one or more second conductive traces (not illustrated), e.g., copper lines, of the carrier 200, e.g., so as to provide a gate signal to the enclosed die.

The package 300 may further comprise a top layer 32 arranged at the package top side 301 and being electrically connected with the second load terminal of the die. The top layer 32 may be made of an electrically conductive material. The top layer 32 may hence exhibit the same electrical potential as the second load terminal of the die, e.g., the high potential (e.g., the drain potential). Further, the top layer 32 may be electrically insulated from the lead frame structure, e.g., from both the first outside terminal(s) 311 and the second outside terminal(s) 312.

For example, the top layer 32 is arranged substantially coplanar with the package top side 301; e.g., the top layer 32 does substantially not protrude from the package top side 301.

The top layer 32 can have a horizontal surface area amounting to at least 50%, to at least 60% or to even more than 80% (but to less than 100%) of the total surface area of the package top side 301. This surface area may be exposed to the environment of the package body 30, i.e., the surface area of the top layer 32 is not enclosed within the package body 30, but forms a part of an exterior wall.

The package 300 is, for example, a top side cooling package with the top layer 32 being configured as a top side cooling. For example, at least most of the heat to be dissipated by the package 300 leaves the package body 30 via the top layer 32.

The present specification refers to an arrangement comprising a plurality of packages 300, e.g., a plurality of packages 300 of the type as exemplarily described with respect to FIG. 3. For example, the plurality of packages (e.g., including the respective enclosed die) are substantially equally configured, e.g., regarding outer dimensions such as height, length, and width.

FIGS. 1A-D and FIG. 4 each illustrate an exemplary embodiment of a power semiconductor arrangement 500 where two packages 300 are provided. In accordance with the exemplary embodiment of the power semiconductor arrangement 500 illustrated in FIGS. 2A-D, 12 packages 300 are provided. These examples are certainly not limiting;

rather, the total number of packages 300 of the power semiconductor arrangement 500 can be greater than two or, respectively, smaller or greater than 12. For example, the total number of packages 300 can be chosen in dependence of a designated total load current capability of the power semiconductor arrangement 500, as will become apparent from the description further below. Further, as indicated above, in an embodiment, the power semiconductor dies enclosed in the packages 300 can be based on silicon (Si). In another embodiment, the power semiconductor dies enclosed in the packages 300 are based on a wide-bandgap (WBG) semiconductor material, e.g., silicon carbide (SiC) or gallium nitride (GaN) or another WBG semiconductor material.

In an embodiment, the plurality of packages 300 are connected in parallel to each other. Hence, the voltage present between the first outside terminals 311 and the top layer 32 can be the same for each of the packages 300. At least, the electrical potential present at the top layer 32 can be the same for each of the packages 300. In an embodiment, each of the dies exhibits an ohmic resistance that increases with an increasing die load current, e.g., such that a beneficial parallelization of the total load current can be ensured.

As indicated above and as illustrated in FIGS. 1A-D, 2A-D and in FIG. 4, the plurality of packages 300 may be mounted on the carrier 200.

The carrier 200 may be a printed circuit-board (PCB) or may be a component of a PCB. In another embodiment, the carrier 200 may be a Direct Copper Bond (DCB) substrate, e.g. a ceramic circuit board, or may be a component of a DCB substrate. In yet another embodiment, the carrier 200 may also be based on an Insulated Metallic Substrate (IMS). The carrier 200 may be made of an electrically insulating material, e.g., made of a polymer, a PCB laminate, a ceramic, a flame retardant (FR) material (e.g., FR4), a composite epoxy material (CEM), such as CEM1 or CEM3, a Bismaleimide-Triazine resin (BT) material, imide, polyimide, ABF, or made of a combination of the aforementioned exemplary materials.

The carrier 200 may exhibit a front side surface 201 with total area of at least 25 cm$^2$, at least 100 cm$^2$ or even more than 375 cm$^2$.

Further, the carrier 200 may be configured to fit at least two, at least five or even more than ten packages (e.g., of substantially equal configuration) on the front side surface 201. Further, a minimum horizontal distance, e.g., along one of the first and the second lateral direction X, Y between two arbitrary ones of the plurality of the packages 300 can amount to at least 3 mm or to at least 5 mm. E.g., such distance is measured between two package sidewalls 303 facing to each other. E.g., the distance can be chosen in dependence of the voltage ratings of the packages 300.

Now referring in more detail to FIGS. 1A-D, 2A-D and FIG. 4, the power semiconductor arrangement 500 comprises a top heatsink 400.

The top heatsink 400 is attached to each of the top layers 32 of the packages 300. For example, the top heatsink is configured to passively dissipate power losses produced by the plurality of packages 300, wherein the power losses may be in the range of at least 100 W. The produced power losses may be even greater than 100 W, e.g., greater than 500 W or even greater than 1 kW. To dissipate these power losses at least partially, the top heatsink 400 is provided.

The top heatsink 400 is electrically contacted to each of the top layers 32 of the packages 300. For example, a low ohmic contact couples the top heatsink 400 to the top layers 32. To this end, the top heatsink 400 can be attached to each of the top layers 32 of the packages 300 by at least one of a solder connection (not illustrated), e.g., a diffusion solder connection or reflow solder connection; an electrically conductive foil (cf. reference numeral 47 in FIG. 4); an electrically conductive adhesion paste (not illustrated); a welded joint (not illustrated). Hence, the electrical potential of the top heatsink 400 may be identical to the electrical potential of the top layers 32, i.e., identical to the electrical potential of the second load terminals of the dies included in the packages 300.

The top heatsink 400 may be made of an electrically conductive material, e.g., comprising one or more of copper, gold, silver, aluminum, a steel and the like.

Regarding the shape of the top heatsink 400, the top heatsink 400 may be a monolithic component, in accordance with an embodiment. E.g., the top heatsink 400 is not made out of a plurality of separate heatsink elements that are coupled to each other, e.g., by means of wires or the like. Rather, in such embodiment, the top heatsink 400 can be a monolithic electrically conductive block with or without one or more structured sides. In a simple form, the top heatsink 400 may exhibit a cuboid form.

In another embodiment (not illustrated), the top heatsink 400 may comprise a plurality of heatsink subunits, e.g., one separate heatsink subunit for one or two or more of the plurality of packages 300, wherein the plurality of heatsink subunits are electrically connected to each other by means of low ohmic connections, e.g., low ohmic bridge components or wires or the like.

The top heatsink 400 has a bottom surface 402 facing to the top layers 32, i.e., the package top sides 301, and a top surface 401 opposite thereof. The bottom surface 402 can be planar; hence, in an embodiment, the planar bottom surface 402 of the top heatsink 400 is attached to the top layers 32 of the packages 300. More specifically, the top layers 32 of the packages 300 can be arranged coplanar with each other, and the planar bottom surface 402 can be arranged in parallel to the top players 32 of the packages 300. For example, the bottom surface 402 has a total area amounting to at least 120% of the sum of the total surface areas of the package top sides 301 of the packages 300. Depending on the density according to which the packages 300 are arranged on the carrier 200, this factor may vary, e.g. also be greater than 150%, for example. But, in an embodiment, the bottom surface is not substantially greater than twice the area defined by the (fictitious) envelope course surrounding the most of the ones of the plurality of packages 300.

Figure 5:
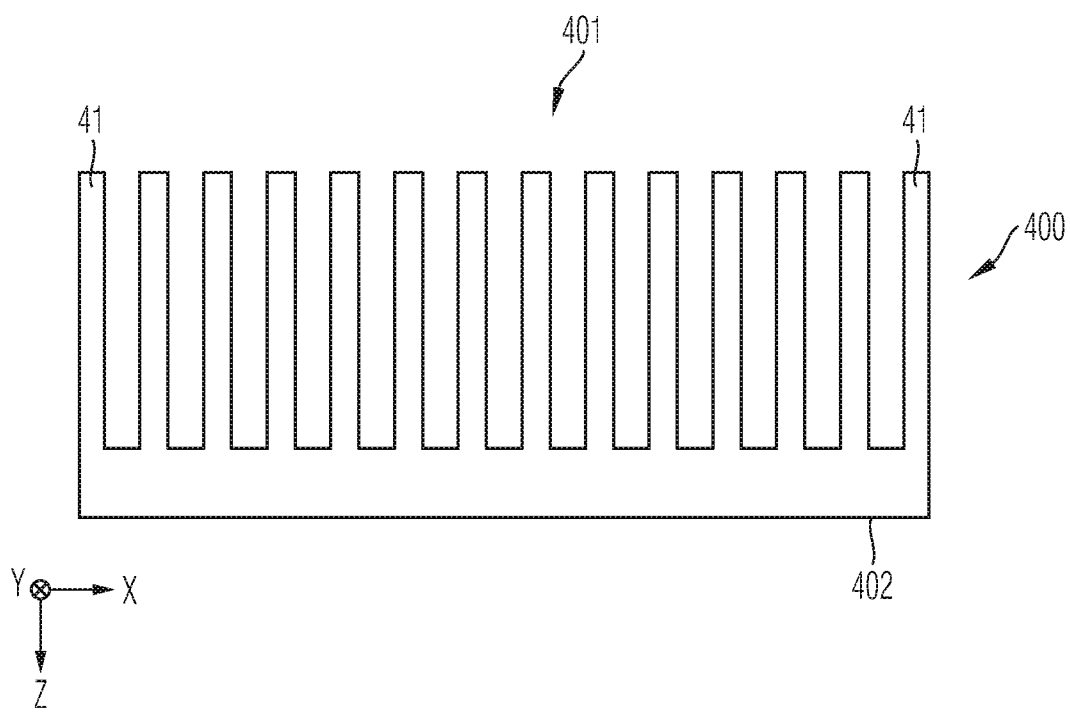
FIG. 5 schematically and exemplarily illustrates a section of a vertical cross-section of a top heatsink in accordance with one or more embodiments.

Still regarding the shape of the top heatsink 400, as illustrated in more detail in FIG. 5, this top surface 401 may be formed by a plurality of cooling fins 41. In an embodiment, the top heatsink 400 exhibits a vertical cross-section, e.g., as exemplarily illustrated in one of FIG. 1C and FIG. 5, that remains unchanged along the lateral direction (e.g. the second lateral direction Y) for at least a distance laterally overlapping with at least two of the plurality of packages 300, or for a distance laterally overlapping with all of the packages 300.

For example, if monolithically implemented, except for the size of the top heatsink 400, the top heatsink 400 is not adapted, e.g., in terms of structure, to the plurality of the packages 300. Hence, in contrast to other embodiments where, for example, said separate heatsink subunit can be provided for each individual package 300, it is possible to provide the (e.g., monolithic) top heatsink 400 for the plurality of packages 300 that are arranged on the carrier 200, in accordance with an embodiment; then, each of the packages 300 is coupled to one and the same top heatsink 400. Hence, the top heatsink 400 may provide for a mechanical and electrical interconnect for all the packages 300.

Regarding the coupling between the top heatsink 400 and the top layers 32, it is referred to co-assigned pending German patent application DE 10 2017 120 747.3 titled "SMD Package with Top Side Cooling"; there, it is inter alia proposed to provide a heat spreader arranged external of a package body and in electrical contact with a top layer with a bottom surface of the heat spreader facing to the top layer, wherein the heat spreader further has top surface, the area of the top surface being greater than the area of the bottom surface. For example, according to such design, it can be ensured that the sections of the heat spreader that cause the surface increase are spatially displaced from a package top surface, such that safety requirements regarding, e.g., a creepage length can be more easily fulfilled. This concept may be analogously applied to the top heat sink 400, in accordance with an embodiment, and as exemplarily illustrated in FIG. 1C, wherein the top surface 401 has obviously a greater area than the bottom surface 402; the illustrated step-like recess at the right side of the top heat sink 400 may provide for an increase between the first outside terminal(s) 311 (e.g., exhibiting the electrical potential of the first load terminal of the die) and the top heat sink 400 (e.g., exhibiting the electrical potential of the second load terminal of the dies).

Now regarding the functionality of the top heatsink 400, in accordance with an embodiment, the top heatsink 400 is not only configured to dissipate power losses produced by the packages 300, but also to conduct at least the sum of the die load currents. For example, the top heatsink 400 may be configured as a conductor rail so as to conduct at least the sum of the die load currents. Such configuration of the top heat sink 400 may also be implemented if the top heat sink is not monolithic, but comprises said (non-illustrated) plurality of heatsink subunits; then, the heatsink subunits would simultaneously conduct a respective portion of at least the sum of the die load currents.

As has already been explained above, the dies included in the packages 300 may be configured to block the voltage applied between their load terminals, and to conduct the die load current. The dies enclosed in the packages 300 can be connected in parallel to each other and configured to be collectively set into a respective conducting state, wherein the top heatsink 400 can be configured to conduct at least the sum of the die load currents during the conducting state. E.g., each of the enclosed dies is configured as a power semiconductor transistor, e.g., a MOSFET. For example, these power semiconductor transistors are collectively turned-on or off, and, once they are all turned on, each transistor conducts a respective share of the total load current conducted by the top heatsink 400.

Figure 2A:
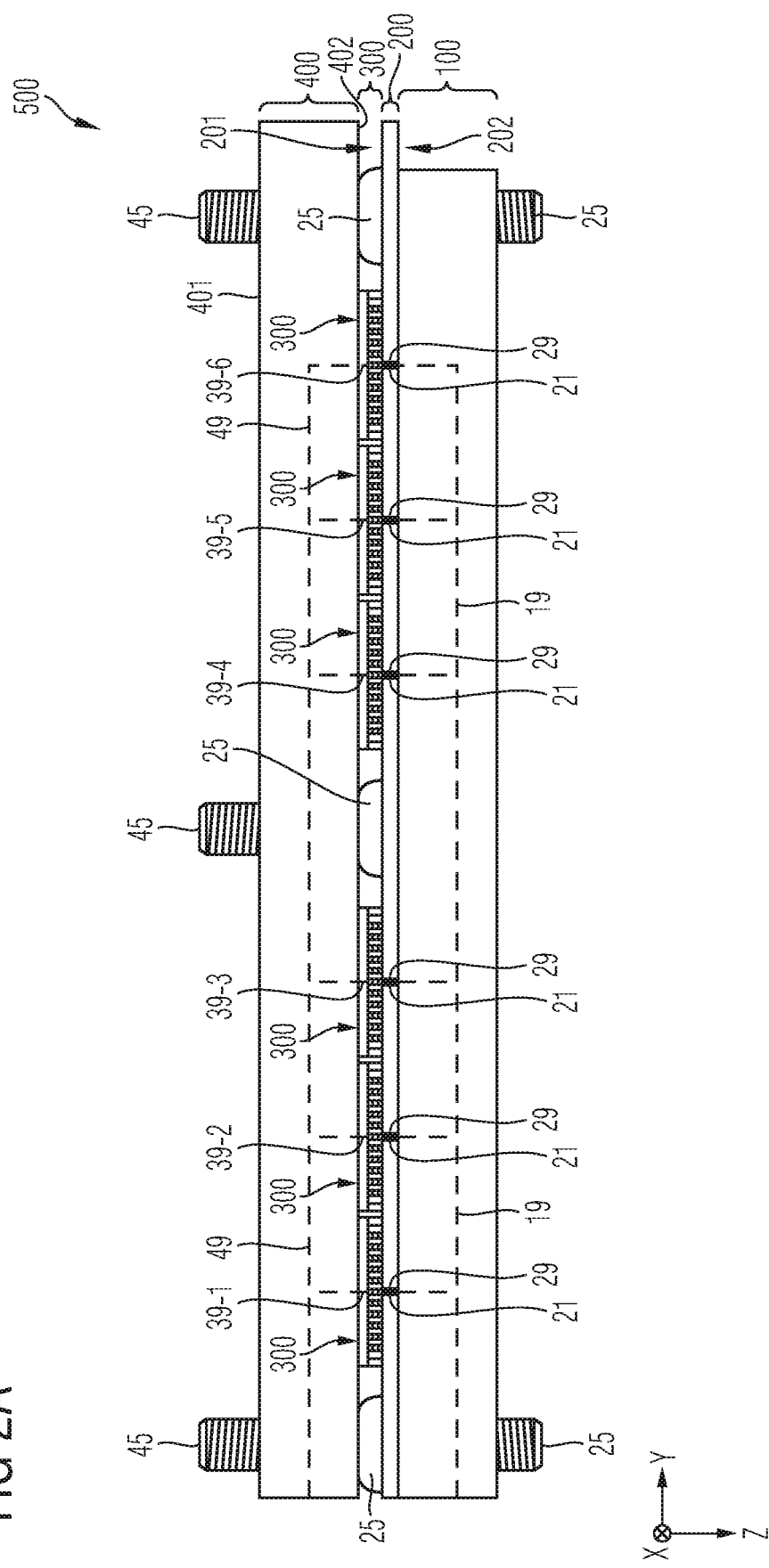
Figure 2B:
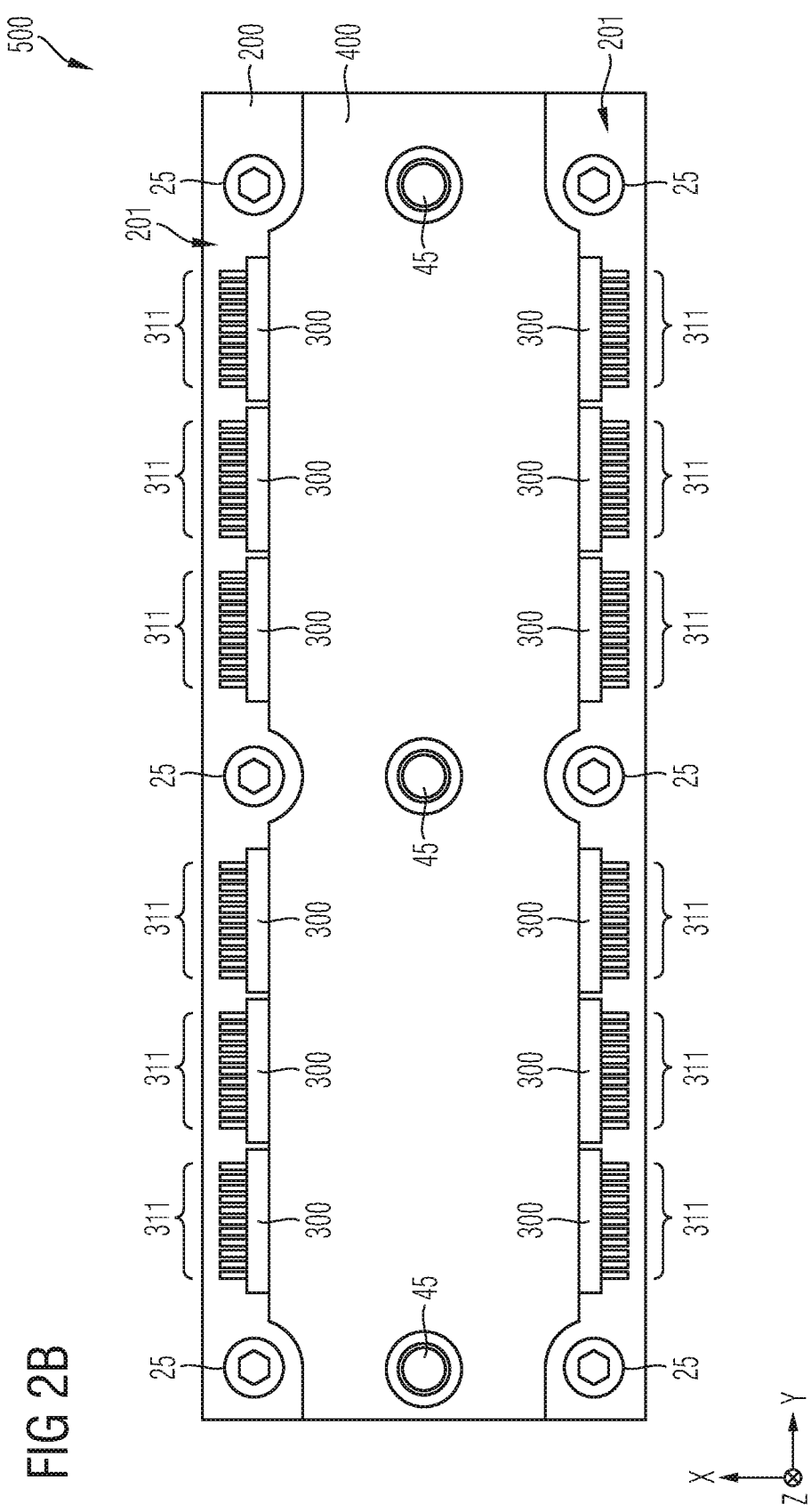

For example, as more clearly illustrated in FIGS. 1A and 2A, the power semiconductor arrangement 500 is configured to conduct the total load current amounting to the sum of the die load currents along a load current path, wherein the load current path is formed at least by means of the top heatsink 400 (cf. reference numeral 49), the packages 300 (cf. reference numerals 39-1 to 39-6) and the carrier 200 (cf. reference numeral 29), and wherein the total load current follows the current path 49, 39-1, 39-2, 29, by consecutively passing through the top heatsink 400, the packages 300 and the carrier 200 or vice versa. Accordingly, the load current conducted by the power semiconductor dies between their respective first load terminal and the respective second load terminal can "leave" or, respectively "enter" the respective package 300 by means of the first outside terminal(s) 311 (that are coupled to the carrier 200) and "enter" or, respectively "leave" the respective package 300 by means of the top layer 32 (that is arranged in electrical contact to the top heatsink 400). Analogously, the power semiconductor arrangement 500 can be configured such that the carrier 200 conducts the total load current either before it enters the packages 300 or after it has passed through the packages 300.

For receiving or, respectively, outputting the total load current from/to external of the power semiconductor arrangement 500, at least one top coupler 45 may be attached to the top heatsink 400. The top coupler 45 may for example be configured as a screw arrangement having a screw 451 and a counter screw (or a nut) 452. In an embodiment, the top coupler 45 is configured to receive or output the total load current from/to the top heatsink 400. For example, the top coupler 45 can be connected to a power cable of a main power path, e.g., by means of an eyelet or the like (not illustrated).

In an embodiment, the top coupler 45 is further configured to mechanically fix the top heatsink 400, e.g. by coupling the top heatsink 400 with the carrier 200, as exemplarily illustrated in FIGS. 2A-D. For example, the screw 451 passes through the top heatsink 400 and extends into the carrier 200.

Further, for dampening mechanical stress that may occur within the power semiconductor arrangement 500, the top coupler 45 may be mounted in spring bearings (not illustrated) or be provided with other dampening elements. In particular, mechanical stress along the vertical direction Z can thereby be dampened and the electrical contact between the top layers 32 and the top heatsink 400 is more reliable.

Now referring in more detail to FIGS. 2A-D and 4, the carrier 200 may comprise conductors 21 electrically connected to the first outside terminals 311 of the packages 300, and hence electrically connected to the first load terminals of the dies. Even though FIGS. 1A-D do not illustrate these conductors 21, it shall be understood that also accordance with these embodiments of FIGS. 1A-D, the conductors 21 may be present in the carrier 200.

In an embodiment, all conductors 21 are electrically connected to each other. Thus, for example, the packages 300, i.e., the power semiconductor dies included therein, are connected in parallel to each other by means of a) the top heatsink 400 and b) the conductors 21 of the carrier 200.

For example, the conductors 21 can be implemented as typical horizontally extending copper lines of a printed circuit. E.g., thereby, the conductors may provide for a load current path portion 29 as schematically illustrated in FIG. 1A (wherein, in FIG. 1A, the conductors 21 are not illustrated).

In another embodiment, as illustrated in FIG. 2A and FIG. 4, each conductor 21 may comprise at least one electrically conductive connection member for each package 300, wherein each connection member extends vertically through the carrier 200 so as to form an electrical connection between a component below the carrier 200 and a respective one of the first outside terminals 311 (e.g., like a vertically extending conductive via or, respectively, a vertically extending conductive pass through passage). For example, the conductors 21 are realized by the electrically conductive connection members. Hence, in the following, also the electrically conductive connection members are referred to using the reference sign 21.

In FIGS. 2A and 4, the electrically conductive connection members 21 are only schematically illustrated. Further, it shall be understood that for each package 300, there may be provided more than only one electrically conductive connection member 21.

By means of the conductors/electrically conductive connection members 21, the carrier 200 provides for said portion 29 of the load current path taken by the total load current conducted by the power semiconductor arrangement 500. Specifically, the carrier 200 may provide for an electrically conductive interface to the first load terminals of the dies enclosed by the packages 300. As explained above with respect to FIG. 1A, the load current path portion 29 may extend substantially horizontally. As will become more apparent from the description of FIGS. 2A-D, the load current path portion 29 may extend substantially vertically, e.g., if the conductors 21 are realized by means of the electrically conductive connection members 21 (e.g., via or pass through passages) that extend vertically through the carrier 200.

In an embodiment, the carrier 200 is void of conductors electrically connected to the top layers 32. Thus, the voltage difference that may be present between the first load terminals and the second load terminals when the power semiconductor dies are in the blocking state (and that may hence be present between the top heatsink 400 and the conductors 21) is for example not observed within the carrier 200. Further, the load current path portion 29 that may be formed within the carrier 200 may for example either conduct the load current that is fed to the packages 300 or the load current that is received from the packages 300, but, e.g., not both. In terms of an electrical equivalent circuit, in an embodiment, the load current path portion 29 formed within the carrier 200 can hence either be connected downstream or upstream to the packages 300.

However, the carrier 200 may be equipped with further conductors (not illustrated) that provide for an electrical connection to the second outside terminals 312 that may be connected to a respective gate terminal of the enclosed power semiconductor dies, as indicated above.

In an embodiment, the component mentioned above that is arranged below the carrier 200 is a bottom heatsink 100. Thus, the top heatsink 400 may be arranged above the carrier 200, e.g., facing to the front side surface 201 of the carrier 200, and the bottom heatsink 100 may be facing to the bottom side surface 202 of the carrier 200.

The bottom heatsink 400 may be electrically contacted to each of the first outside terminals 311 of the packages 300. Thus, the bottom heatsink 400 may be electrically connected to the first load terminals of the enclosed power semiconductor dies. In an embodiment, this electrical connection is at least partially realized by said vertical extending electrically conductive connection members 21, as illustrated in FIGS. 2A and 4.

The bottom heatsink 100 may be similarly configured as the top heatsink 400, both regarding its spatial dimensions and its functionality. Hence, regarding exemplary configurations of the bottom heatsink 100, it is fully referred to the exemplary configurations of the top heatsink 400 explained above. For example, also the bottom heatsink 100 can be configured to conduct at least the sum of the die load currents.

Again regarding the load current path taken by the total load current of the power semiconductor arrangements 500, if the power semiconductor dies are in the conducting state, the load current can be received from external of the power semiconductor arrangement 500 via the top coupler 45 and then proceed along the first path portion 49 through the top heatsink 400 so as to divide into the plurality of path portions 39-1, . . . , 39-6 realized by the packages 300, leave the packages 300 by the first outside terminals 311 that interface with the vertically extending electrically conductive connection members 21 that provide the path portions 29 within the carrier 200, and then reunite within the bottom heatsink 100 that provides the load current path portion 19, which for example may join into one or more bottom couplers 25 that may form at least a part of an interface to external of the power semiconductor arrangement 500.

Analogously to the one or more top couplers 45, one or more bottom couplers 25 may be configured to interface with a power cable of a main power path, e.g., by means of an eyelet or other termination structure of a power cable. Also, the one or more bottom couplers 25 may be configured to mechanically fix the bottom heatsink 100, e.g., also to the carrier 200.

Figure 2D:
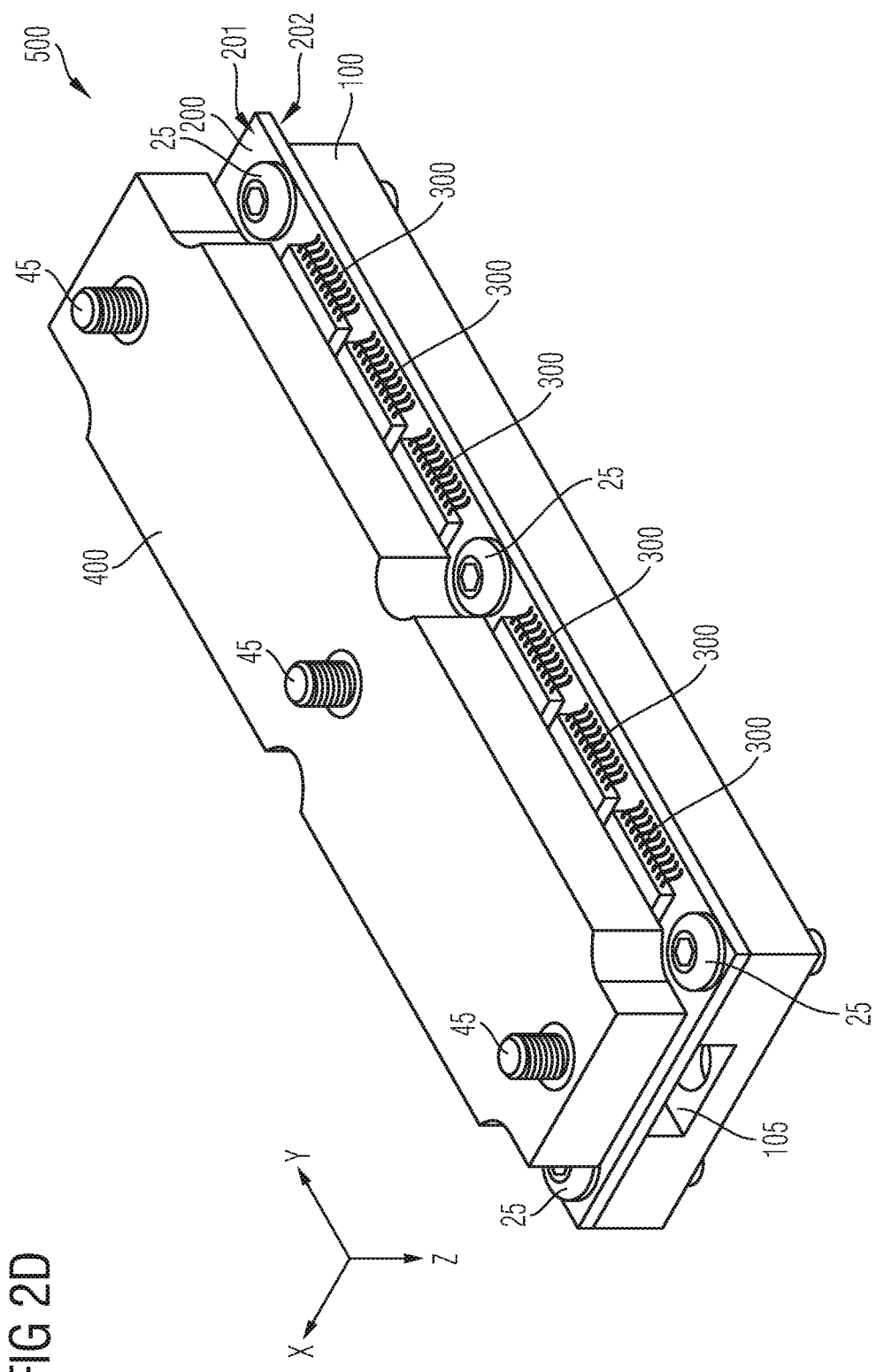

Of course, the top heatsink 400 is electrically insulated from the bottom heatsink 100. Accordingly, also the top couplers 45 can be electrically insulated from the bottom couplers 25 (wherein it should be clear that, if the dies are in the conducting state, the voltage difference between components 400 and 100 (45 and 25, respectively) is almost zero). Hence, even though the bottom couplers 25 illustrated as being arranged in proximity to the top heatsink 400 (cf. FIG. 2B), it shall be understood that the bottom couplers 25 are electrically insulated from the top heatsink 400. The same applies for the relationship between the top couplers 45 and the bottom heatsink 100. For example, the bottom heatsink 100 may be provided with a recess region 105 facing to the bottom side surface 202 of the carrier 200 so as to allow for sufficient room to install the top coupler 45, as illustrated in FIGS. 2C-D.

In an embodiment, the carrier 200 extends within a horizontal layer, wherein the total load current conducted by the power semiconductor arrangement 500 passes through said horizontal layer exclusively along the vertical direction Z perpendicular to said horizontal layer. For example, to this end, said vertically extending and electrically conductive connection members 21 may be provided. In an embodiment, the electrically conductive connection members 21 amount to share of less than 10% of the total volume of the horizontal layer, the remaining portion of the volume of the horizontal layer being formed by the remaining portion of the carrier 200. Thus, the total load current essentially does not traverse the carrier 200 along the horizontal direction (e.g., along the first lateral direction X or along the second lateral direction Y), but only along the vertical direction Z. For example, thereby, the carrier 200 can be of a low complexity and of low cost, as no horizontally extending power paths must be implemented within the carrier 200. In addition, this variant may provide for an improved dampening of undesired electrical fields external of the packages 300 that may occur due to operation of the power semiconductor dies enclosed in the packages 300.

The thickness of the carrier 200 along the vertical direction Z can be within the range of e.g., 1 mm to 3 mm, e.g., in a range of typical printed circuit boards. For example, since, in accordance with an embodiment, the total load current must not necessarily be conducted along the horizontal directions within the carrier 200, the carrier 200 can be designed such that it has a comparatively small thickness. For example, once the load current has passed through the packages 300 and through the carrier 200, e.g., substantially along the vertical direction Z, the total load current may then be conducted along the horizontal directions (e.g., X, Y) by means of the bottom heat sink 100 rather than through the carrier 200. Depending on the designated appliance in which the power semiconductor arrangement 500 shall be employed, the thickness of the carrier 200 may however be varied and deviate from said range.

Further, at least one of the top heatsink 400 and the bottom heatsink 100 may be equipped with at least one anti-thermal-stress component (not illustrated) in order to compensate for mechanical stress along the horizontal directions, e.g., along at least one of the first lateral direction Y and the second lateral direction Y. However, as the packages 300 may be equally configured and as hence the total load current conducted by these packages 300 should be equally distributed and as hence the power losses produced by the packages 300 correspondingly be equally distributed, the heat distribution within the heatsinks 100 and 400 are assumed to be homogeneously distributed. Thus, thermal stress produced by local peaks of temperature should not occur.

Presented herein is also a method of manufacturing a power semiconductor arrangement that comprises providing a carrier; and providing a plurality of packages. Each package: encloses a power semiconductor die, wherein the die has a first load terminal and a second load terminal and is configured to block a blocking voltage applied between said load terminals and to conduct a die load current between said load terminals; has a package body with a package top side, a package footprint side and package sidewalls, the package sidewalls extending from the package footprint side to the package top side; has a lead frame structure configured to electrically and mechanically couple the package to the carrier with the package footprint side facing to the carrier, the lead frame structure comprising at least one first outside terminal electrically connected with the first load terminal of the die; has a top layer arranged at the package top side and being electrically connected with the second load terminal of the die. The method further comprises providing a top heatsink that is configured to conduct at least the sum of the die load currents. Then, the top heatsink is attached to each of the top layers of the packages such that the top heatsink is electrically contacted to each of the top layers of the packages.

Regarding exemplary embodiments of the manufacturing method, it is fully referred to the above. Hence, the optional features of the embodiments of the power semiconductor arrangement 500 described above with respect to FIGS. 1A-5 may analogously be provided for forming embodiments of the manufacturing method. For example, coupling the top heatsink 400 to the top layers 32 of the packages 300 may involve at least one of carrying out a solder processing step, providing an electrically conductive foil, providing an electrically conductive adhesion paste, a carrying out a welding processing step.

Figure 6:
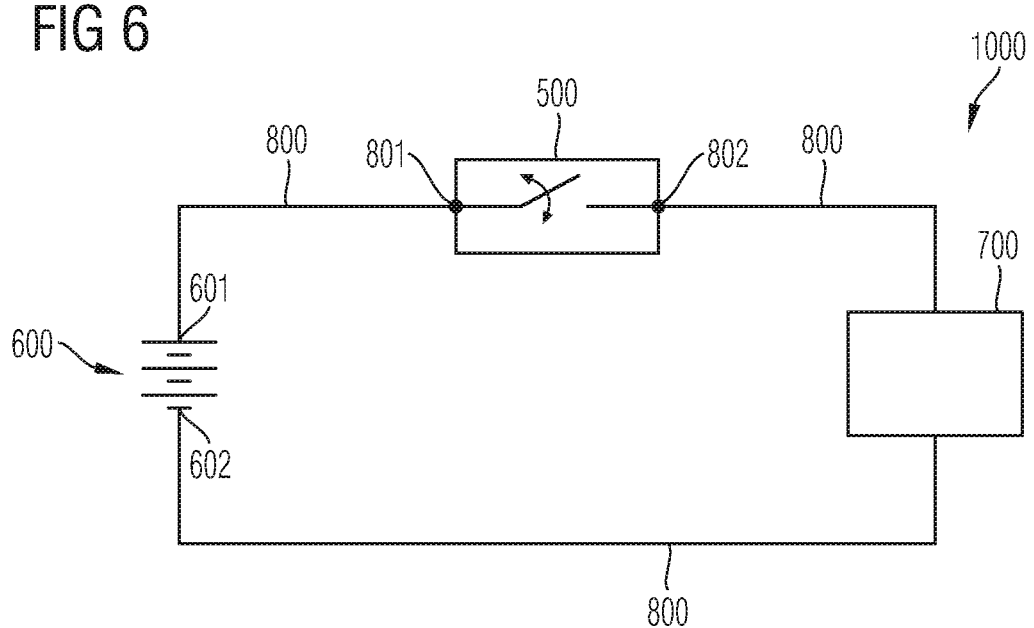
FIG. 6 schematically and exemplarily illustrates a circuit diagram of a system comprising a power semiconductor arrangement in accordance with one or more embodiments.

Further presented herein is a system 1000, an embodiment of which is schematically and exemplarily illustrated in FIG. 6. The system 1000 comprises a DC power supply 600, a load subsystem 700 and a main power path 800 that couples the DC power supply 600 to the load subsystem 700 so as to allow the DC power supply 600 to provide power to the load subsystem 700 via the main power path 800.

The system 1000 further comprises a power semiconductor arrangement 500 that is configured in accordance with one or more of the examples as described above with respect to FIGS. 1A-5. The power semiconductor arrangement 500 is arranged in the main power path 800 and is configured to selectively set the main power path 800 in one of a conducting state and a blocking state.

For example, an input power cable of the main power path 800 interfaces with the power semiconductor arrangement 500 by means of a first termination 801, which may include, as indicated above, means that are configured to couple to the one or more top couplers 45, e.g., comprising an eyelet. The first termination 801 may be electrically connected to the first output terminal 601 of the DC power supply 600, which may have the high potential of the DC power supply 600.

An output power cable of the main power path 800 can interface with the power semiconductor arrangement 500 by means of a second termination 802, which may include, as indicated above, means that are configured to couple to the one or more bottom couplers 25. The second termination 802 may be coupled to the second output terminal 602 of the DC power supply 600 by means of the load subsystem 700.

The DC power supply 600 may comprise a battery arrangement, e.g., a battery of a vehicle. In an embodiment, the DC power supply 600 may comprise a switched mode power supply, such as a buck and/or boost converter. The load subsystem 700 may comprise one or more electrical loads, e.g., electrical loads of a vehicle, such as electrical drives and switched mode power supplies, e.g., for operating brakes, seats and other consumers of electrical energy.

As described above, the power semiconductor arrangement 500 may be configured to set the main power path 800 in one of the conducting state and the blocking state. During the blocking state, the load subsystem 700 cannot be supplied with energy of the DC power supply 600. In the conducting state of the main power path 800, the load current can be conducted along the main power path 800 including the power semiconductor arrangement 500.

The power semiconductor arrangement 500 may, in the illustrated configuration of FIG. 6, serve as a main power switch. For example, the power semiconductor arrangement 500 is turned on and off at a comparatively low and varying switching frequency. Hence, the power semiconductor dies included in the packages 300 of the power semiconductor arrangement 500 can be optimized with respect to a priority of low conduction losses over low switching losses. As explained above, for dissipating the conduction losses, the top heatsink 400 is provided that may simultaneously serve as a conductor rail for conducting the load currents of the plurality of power semiconductor dies.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor arrangement, comprising:
   a carrier;
   a plurality of packages, wherein each package:
      encloses a power semiconductor die, wherein the die has a first load terminal and a second load terminal and is configured to block a blocking voltage applied between the first and the second load terminals and to conduct a die load current between the first and the second load terminals;
      has a package body with a package top side, a package footprint side and package sidewalls, the package sidewalls extending from the package footprint side to the package top side;
      has a lead frame structure configured to electrically and mechanically couple the package to the carrier with the package footprint side facing the carrier, the lead frame structure comprising at least one first outside terminal electrically connected with the first load terminal of the die;
      has a top layer arranged at the package top side and electrically connected with the second load terminal of the die; and
   a top heatsink, wherein the top heatsink:
      is attached to each of the top layers of the packages,
      is electrically contacted to each of the top layers of the packages, and
      is configured to conduct at least the sum of the die load currents.

2. The power semiconductor arrangement of claim 1, wherein the top heatsink is configured to passively dissipate power losses produced by the plurality of the packages of at least 100 W.

3. The power semiconductor arrangement of claim 1, wherein the top heatsink is configured as a conductor rail.

4. The power semiconductor arrangement of claim 1, wherein the dies enclosed in the packages are connected in parallel to each other and configured to be collectively set into a respective conducting state, and wherein the top heatsink is configured to conduct at least a sum of the die load currents during the conducting state.

5. The power semiconductor arrangement of claim 1, wherein the top heatsink has a planar bottom surface attached to the top layers of the packages.

6. The power semiconductor arrangement of claim 5, wherein the top layers of the packages are arranged coplanar with each other, and wherein the planar bottom surface is arranged in parallel to the top layers of the packages.

7. The power semiconductor arrangement of claim 5, wherein the planar bottom surface has a total area amounting to at least 120% of a sum of the total surface areas of the package top sides of the packages.

8. The power semiconductor arrangement of claim 1, wherein the power semiconductor arrangement is configured to conduct a total load current amounting to the sum of the die load currents along a load current path, wherein the load current path is formed at least by the top heatsink, the packages and the carrier, and wherein the total load current follows the current path by passing through the top heatsink, the packages and the carrier.

9. The power semiconductor arrangement of claim 1, wherein the carrier comprises conductors electrically connected to the first outside terminals of the packages.

10. The power semiconductor arrangement of claim 1, wherein the carrier is void of conductors electrically connected to the top layers.

11. The power semiconductor arrangement of claim 1, wherein at least one of the enclosed power semiconductor dies is based on a wide-bandgap semiconductor material.

12. The power semiconductor arrangement of claim 1, wherein the top heatsink has a vertical cross-section that remains unchanged along a lateral direction for at least a distance laterally overlapping with at least two of the plurality of packages.

13. The power semiconductor arrangement of claim 1, wherein the top heatsink is attached to each of the top layers of the packages by:
   a solder connection; and/or
   an electrically conductive foil; and/or
   an electrically conductive adhesion paste; and/or
   a welded joint.

14. The power semiconductor arrangement of 1, further comprising a top coupler attached to the top heatsink and configured receive or output a total load current.

15. The power semiconductor arrangement of claim 14, wherein the top coupler is configured to couple the top heatsink with the carrier.

16. The power semiconductor arrangement of claim 1, further comprising a bottom heatsink, wherein the top heatsink is arranged above the carrier, and wherein the bottom heatsink is arranged below the carrier, electrically contacted to each of first outside terminals of the packages, and configured to conduct at least the sum of the die load currents.

17. The power semiconductor arrangement of claim 16, wherein the carrier comprises conductors electrically connected to the first outside terminals of the packages, and wherein the conductors comprise at least one electrically conductive connection member for each package, wherein each connection member extends vertically through the carrier to form an electrical connection between the bottom heatsink and a respective one of the first outside terminals.

18. The power semiconductor arrangement of claim 1, wherein the carrier extends within a horizontal layer, and wherein a total load current conducted by the power semiconductor arrangement passes through the horizontal layer exclusively along a vertical direction perpendicular to the horizontal layer.

19. A system, comprising:
   a DC power supply;
   a load subsystem;
   a main power path that couples the DC power supply to the load subsystem to allow the DC power supply to provide power to the load subsystem via the main power path; and
   the power semiconductor arrangement of claim 1 arranged in the main power path, wherein the power semiconductor arrangement is configured to selectively set the main power path in one of a conducting state and a blocking state.

20. A method of manufacturing a power semiconductor arrangement, the method comprising:
   providing a carrier;
   providing a plurality of packages at the carrier, wherein each package:
      encloses a power semiconductor die, wherein the die has a first load terminal and a second load terminal and is configured to block a blocking voltage applied between said load terminals and to conduct a die load current between said load terminals;

has a package body with a package top side, a package footprint side and package sidewalls, the package sidewalls extending from the package footprint side to the package top side;

has a lead frame structure configured to electrically and mechanically couple the package to the carrier with the package footprint side facing the carrier, the lead frame structure comprising at least one first outside terminal electrically connected with the first load terminal of the die;

has a top layer arranged at the package top side and being electrically connected with the second load terminal of the die; and attaching a top heatsink, which is configured to conduct at least a sum of the die load currents, to each of the top layers of the packages such that the top heatsink is electrically contacted to each of the top layers of the packages.

* * * * *

UNITED STATES PATENT AND TRADEMARK OFFICE
CERTIFICATE OF CORRECTION

PATENT NO. : 10,755,999 B2
APPLICATION NO. : 16/363570
DATED : August 25, 2020
INVENTOR(S) : R. Otremba et al.

Page 1 of 1

It is certified that error appears in the above-identified patent and that said Letters Patent is hereby corrected as shown below:

In the Claims

Column 18, Line 19, please change "configured receive" to -- configured to receive --.

Signed and Sealed this
Fifteenth Day of December, 2020

Andrei Iancu
*Director of the United States Patent and Trademark Office*